US009187827B2

(12) United States Patent
Furuta et al.

(10) Patent No.: US 9,187,827 B2
(45) Date of Patent: Nov. 17, 2015

(54) SUBSTRATE SUPPORT WITH CERAMIC INSULATION

(71) Applicant: APPLIED MATERIALS, Inc., Santa Clara, CA (US)

(72) Inventors: Gaku Furuta, Sunnyvale, CA (US); John M. White, Hayward, CA (US); Shinichi Kurita, San Jose, CA (US); Soo Young Choi, Fremont, CA (US); Suhail Anwar, Saratoga, CA (US); Robin L. Tiner, Santa Cruz, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 13/773,579

(22) Filed: Feb. 21, 2013

(65) Prior Publication Data

US 2013/0228124 A1   Sep. 5, 2013

Related U.S. Application Data

(60) Provisional application No. 61/606,729, filed on Mar. 5, 2012.

(51) Int. Cl.
C23C 16/458       (2006.01)
H01J 37/32        (2006.01)

(52) U.S. Cl.
CPC ............ C23C 16/458 (2013.01); C23C 16/4585 (2013.01); H01J 37/32559 (2013.01); H01J 37/32577 (2013.01); H01J 37/32715 (2013.01)

(58) Field of Classification Search
CPC ................ H01J 37/32642; H01J 37/32; H01J 37/32577; H01J 37/32559; H01J 37/32715; C23C 16/4585; C23C 16/458; H01L 21/68721; H01L 21/68735
USPC ................................................... 118/720, 726
See application file for complete search history.

(56) References Cited

U.S. PATENT DOCUMENTS 5,304,248  A  *  4/1994  Cheng et al. .................. 118/728
5,345,999  A  *  9/1994  Hosokawa .................... 165/80.2
5,494,522  A  *  2/1996  Moriya et al. ............. 118/723 R
5,522,937  A     6/1996  Chew et al.
5,552,124  A  *  9/1996  Su .............................. 156/345.1

(Continued)

OTHER PUBLICATIONS

International Search Report and Written Opinion for PCT/US2013/027168 dated Jul. 23, 2013.

Primary Examiner — Gordon R Baldwin
Assistant Examiner — Aiden Lee
(74) Attorney, Agent, or Firm — Patterson & Sheridan, LLP

(57) ABSTRACT

Embodiments of the present invention generally relates to substrate supports for use in a plasma processing chamber. The substrate supports, which are metallic, have ceramic inserts to prevent arcing between the substrate support and the shadow frame used to protect the edges of the substrate support during processing. In large area substrate processing chambers, the shadow frame may comprise multiple pieces. The individual pieces may be coupled together, but spaced slightly apart by a gap to permit thermal expansion. Ceramic inserts are positioned on the substrate support so that when a shadow frame is positioned adjacent thereto, the ceramic inserts are located adjacent the gaps in the shadow frame. The ceramic inserts adjacent the gap prevent and/or reduce the arcing because the gaps are located over electrically insulating material rather than electrically conductive material.

11 Claims, 5 Drawing Sheets

(56) References Cited

U.S. PATENT DOCUMENTS

| | | | |
|---|---|---|---|
| 6,364,957 B1 * | 4/2002 | Schneider et al. | 118/728 |
| 6,541,343 B1 | 4/2003 | Murthy et al. | |
| 6,834,613 B1 * | 12/2004 | Miyazaki et al. | 118/723 R |
| 7,501,161 B2 | 3/2009 | Hou et al. | |
| 2005/0034673 A1 * | 2/2005 | Kim | 118/728 |
| 2005/0266174 A1 * | 12/2005 | Hou et al. | 427/569 |
| 2006/0207508 A1 | 9/2006 | Leung | |
| 2007/0246062 A1 * | 10/2007 | Lai et al. | 134/1.1 |
| 2008/0194169 A1 | 8/2008 | Sterling et al. | |
| 2009/0283036 A1 | 11/2009 | Duong et al. | |
| 2009/0294064 A1 * | 12/2009 | Nagayama | 156/345.39 |
| 2010/0065216 A1 | 3/2010 | Tiller et al. | |
| 2010/0089319 A1 * | 4/2010 | Sorensen et al. | 118/723 E |

\* cited by examiner

SUBSTRATE SUPPORT WITH CERAMIC INSULATION

CROSS-REFERENCE TO RELATED APPLICATIONS

This application claims benefit of U.S. Provisional Patent Application Ser. No. 61/606,729 (APPM/16808L), filed Mar. 5, 2012, which is herein incorporated by reference.

BACKGROUND OF THE INVENTION

1. Field of the Invention

Embodiments of the present invention generally relate to substrate supports for use in a plasma processing chamber.

2. Description of the Related Art

Televisions, computer monitors and other flat panel displays (FPDs) are typically fabricated in large area substrate processing chambers. These large area processing chambers are designed to process rectangular shaped substrates in order to maximize the effective use of the substrate. As most FPDs are rectangular in shape, a processing chamber designed to process circular shaped substrates, such as semiconductor wafers, may not be desirable due to the amount of wasted substrate that would need to be removed to form the final shape of the rectangular FPD.

As the large area processing chambers continue to increase in size, fabricating the various chamber components out of a unitary piece become difficult. Thus, some chamber components may comprise multiple pieces. Each piece may expand and contract due to thermal expansion issues. Therefore, the multiple pieces may be spaced slightly apart to create a gap between adjacent pieces. If the pieces are biased, arcing can easily occur within the chamber.

Therefore, there is a need in the art for avoiding arcing in a large area processing chamber where multi-piece components are utilized.

SUMMARY OF THE INVENTION

Embodiments of the present invention generally relates to substrate supports for use in a plasma processing chamber. The substrate supports, which are metallic, have ceramic inserts to prevent arcing between the substrate support and the shadow frame used to protect the edges of the substrate support during processing. In large area substrate processing chambers, the shadow frame may comprise multiple pieces. The individual pieces may be coupled together, but spaced slightly apart by a gap to permit thermal expansion. Ceramic inserts are positioned on the substrate support so that when a shadow frame is positioned adjacent thereto, the ceramic inserts are located adjacent the gaps in the shadow frame. The ceramic inserts adjacent the gap prevent and/or reduce the arcing because the gaps are located over electrically insulating material rather than electrically conductive material.

In one embodiment, a shadow frame to be disposed in a chamber body is disclosed. The shadow frame comprises a first piece, a second piece spaced from the first piece by a gap and one or more coupling elements coupled to the first piece and the second piece.

In another embodiment, an apparatus is disclosed. The apparatus comprises a chamber body, a rectangular substrate support disposed in the chamber body and having a first portion having a first thickness that surrounds a second portion having a second thickness that is greater than the first thickness, and a ceramic insert coupled to the substrate support and having a first top surface that is parallel to the top surface of the first portion and a second top surface that is parallel to the top surface of the second portion.

In another embodiment, a substrate support is disclosed. The substrate support includes a rectangular substrate support body having a first portion having a first thickness that surrounds a second portion having a second thickness that is greater than the first thickness and a ceramic insert coupled to the substrate support body and having a first top surface that is parallel to the top surface of the first portion and a second top surface that is parallel to the top surface of the second portion.

In another embodiment, a plasma enhanced chemical vapor deposition apparatus is disclosed. The apparatus includes a chamber body, a gas distribution showerhead disposed in the chamber body, a rectangular substrate support disposed in the chamber body opposite the gas distribution showerhead and having a first portion having a first thickness that surrounds a second portion having a second thickness that is greater than the first thickness, a ceramic insert coupled to the substrate support and having a first top surface that is parallel to the top surface of the first portion and a second top surface that is parallel to the top surface of the second portion, and a shadow frame disposed in the chamber body. The shadow frame comprises a first piece, a second piece spaced from the first piece by a gap and one or more coupling elements coupled to the first piece and the second piece.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention generally relates to substrate supports for use in a plasma processing chamber. The substrate supports, which are metallic, have ceramic inserts to prevent arcing between the substrate support and the shadow frame used to protect the edges of the substrate support during processing. In large area substrate processing chambers, the shadow frame may comprise multiple pieces. The individual pieces may be coupled together, but spaced slightly apart by a gap to permit thermal expansion. Ceramic inserts are positioned on the substrate support so that when a shadow frame is positioned adjacent thereto, the ceramic inserts are located adjacent the gaps in the shadow frame. The ceramic inserts adjacent the gap prevent and/or reduce the arcing because the gaps are located over electrically insulating material rather than electrically conductive material.

Description below will be made with reference to a plasma enhanced chemical vapor deposition (PECVD) chamber, such as a 90K PECVD chamber available from AKT America, Inc, a subsidiary of Applied Materials, Inc., Santa Clara, Calif. It is to be understood that the embodiments discussed herein may be practiced in other processing chambers as well, including those sold by other manufacturers.

Figure 1A:
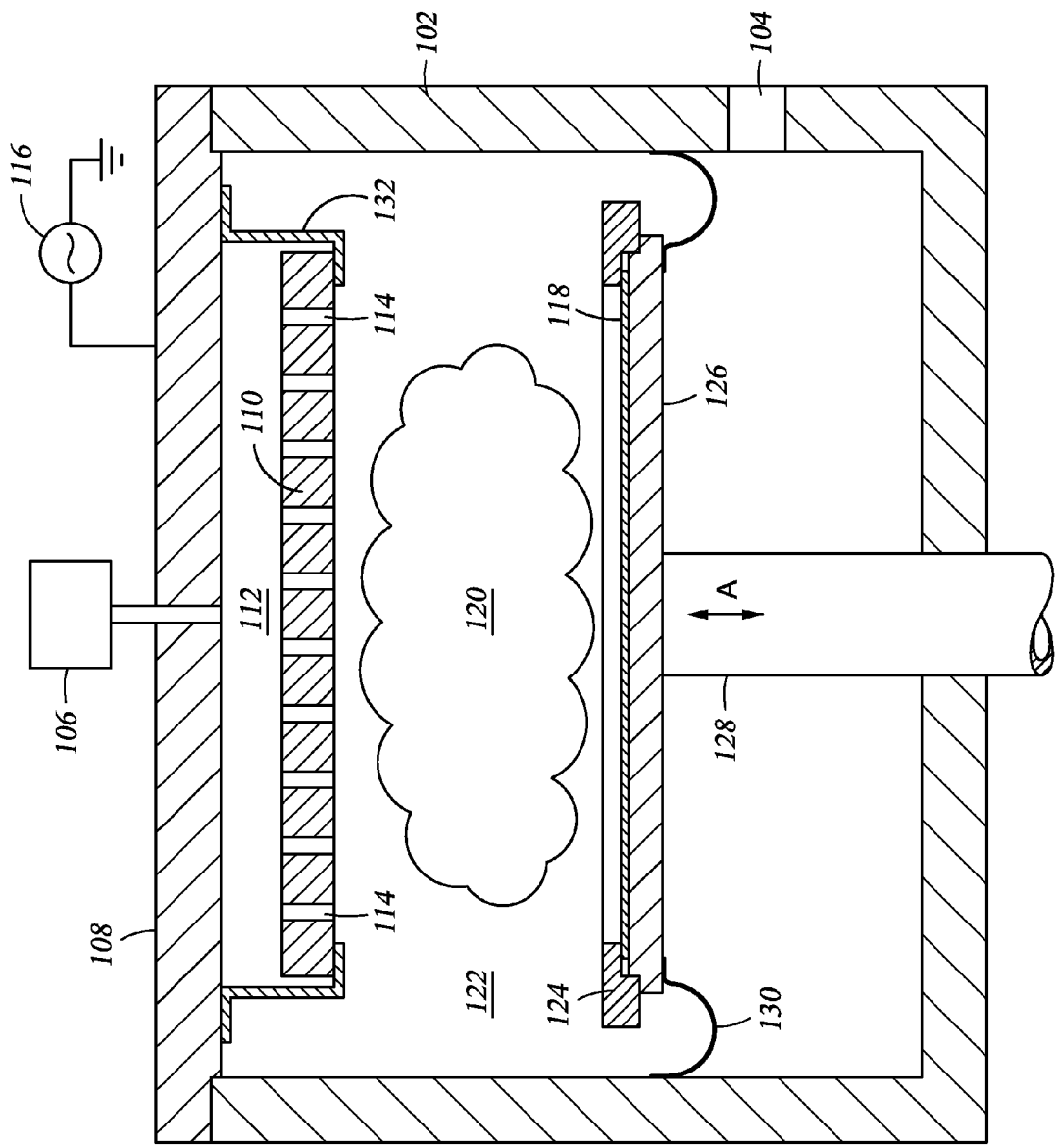
FIG. 1A is a schematic cross-sectional view of an apparatus according to an embodiment of the invention.

FIG. 1A is a schematic cross-sectional view of an apparatus 100 according to an embodiment of the invention. The apparatus 100 includes a chamber body 102 having an opening 104 through at least one wall through which substrates may enter and exit the chamber body 102. A gas distribution showerhead 110 is disposed opposite a substrate support 126 in the chamber. The substrate support 126 is movable on a stem 128 in a direction perpendicular to the face of the gas distribution showerhead 110 that is opposite the backing plate 108, as shown by arrows "A". The substrate support 126 may comprise an electrically conductive material such as aluminum or anodized aluminum.

Figure 1B:
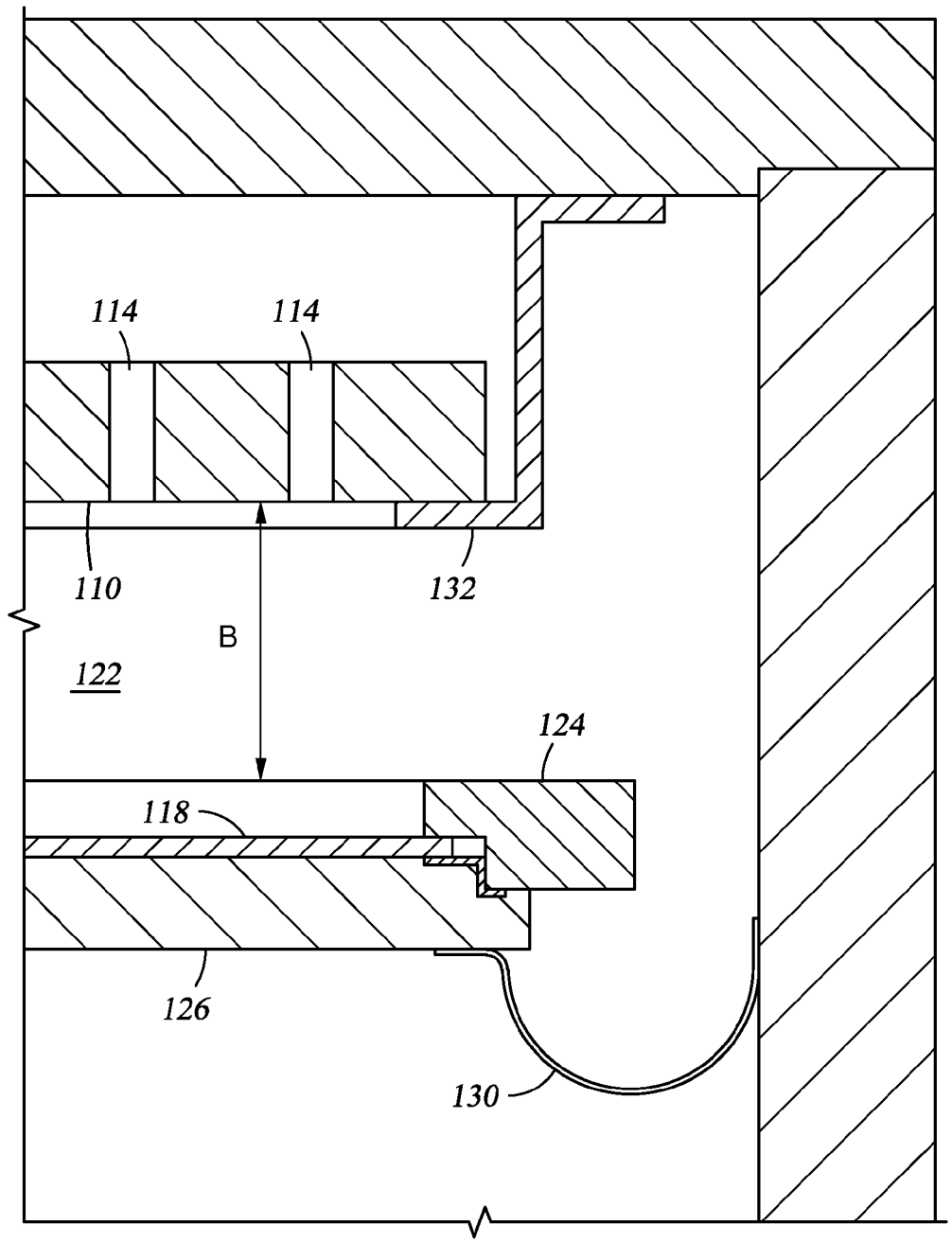
FIG. 1B is a schematic close up view of the apparatus of FIGS. 1A and 1B.

As shown in more detail in FIG. 1B, the substrate support 126 has a rectangular cross section and has multiple different levels. The lower most level is where the shadow frame 124 rests during substrate 118 processing. The upper most level is where the substrate 118 is disposed. The lower level entirely surrounds the upper level.

Processing and/or cleaning gas is delivered to the processing area 122 of the apparatus 100 from a gas source 106. The gas enters the chamber through the backing plate 108 that is spaced from a gas distribution showerhead 110. The gas, upon exiting the opening in the backing plate 108, expands into a plenum 112 formed between the gas distribution showerhead 110 and the backing plate 108. The gas then travels from the plenum 112 into the processing area 122 by passing through gas passages 114 formed in the gas distribution showerhead 110. Once in the processing area 122, the gas is ignited into a plasma.

During operation, RF power is delivered from an RF power source 116 to the backing plate 108. The RF current travels along the backside of the backing plate 108 to a bracket 132 that not only supports the gas distribution showerhead 110, but also electrically couples the gas distribution showerhead 110 to the backing plate 108. RF current travels along the surface of an electrically conductive structure and thus does not enter the plenum 112. The RF current travels along the face of the gas distribution showerhead 110 that is opposite the backing plate 108 and ignites the processing gas into a plasma 120 in the processing area 122. The RF current seeks to return to the source driving it.

In order to have a more predictable RF return path, an RF return mechanism 130 may provide an electrical connection between the substrate support 126 and the walls of the chamber body 102. It is to be understood that RF return mechanism 130 may comprise any suitable mechanism upon which the RF current can travel such as a metal strap. As shown in FIG. 1A, the RF return mechanism 130 may be coupled to the wall at a location above the opening 104 in the chamber body. However, it is to be understood that the RF grounding mechanism may couple to the chamber body 102 at other locations.

When the RF return mechanism 130 is coupled to the chamber wall above the opening 104, the RF return path is shortened because the RF current does not need to travel down the stem 128 and along the bottom of the chamber body 102 before moving up the chamber walls. It is believed that because the distance is shorter, arcing can occur between the gas distribution showerhead 110 and the shadow frame 124 even though the distance between the shadow frame 124 and the gas distribution showerhead 110, represented by arrows "B", is the same.

To alleviate the arcing, the shadow frame 124 may comprise an insulating material, such as a ceramic material. As discussed above, for large area processing chambers, fabricating a shadow frame 124 from a single piece of material may be quite expensive and difficult to fabricate. Therefore, the shadow frame 124 may comprise multiple pieces.

Figure 2:
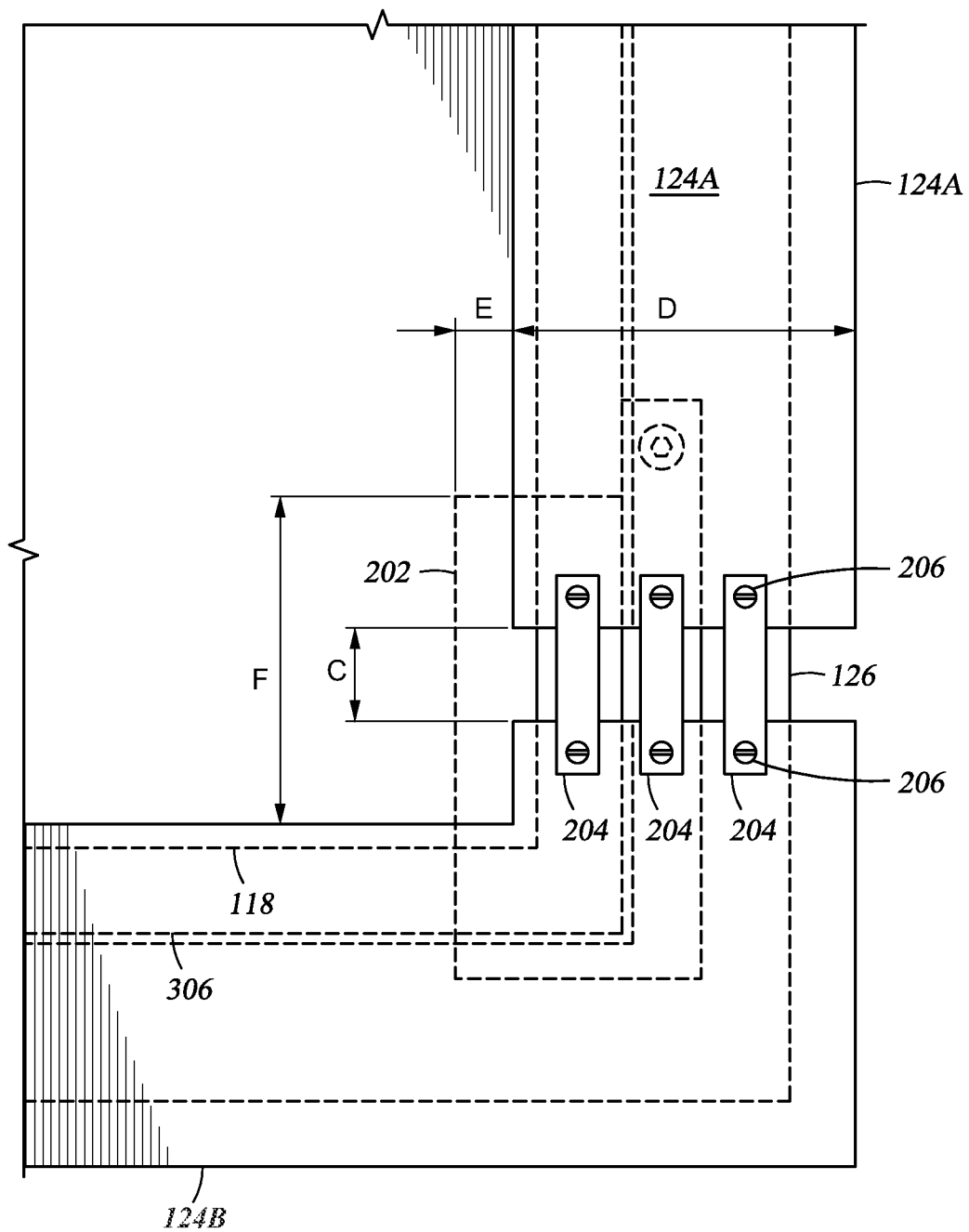
FIG. 2 is a schematic top close up view of the apparatus of FIGS. 1A and 1B.

FIG. 2 is a schematic top close up view of the apparatus 100 of FIGS. 1A and 1B. As shown in FIG. 2, the shadow frame has two pieces 124A, 124B that are coupled together by coupling elements 204. Because the shadow frame 124 has multiple pieces 124A, 124B, the pieces 124A, 124B will be spaced apart for thermal expansion purposes.

The coupling elements 204 may comprise a metallic material such as aluminum. Aluminum, which has a high thermal conductivity, will expand and contract and thus permit the space (represented by arrows "C") between the adjacent shadow frame pieces 124A, 124B change throughout processing without the adjacent pieces 124A, 124B directly contacting one another. It is contemplated that the coupling elements 204 may comprise a ceramic material. The coupling elements 204 are coupled to the respective pieces 124A, 124B by one or more fasteners 206 such as a screw. It is to be understood that while three coupling elements 204 have been shown, more or less coupling elements 204 may be utilized. The coupling elements 204 may be evenly spaced along the width (shown by arrows "D") of the pieces 124A, 124B.

Due to the space between adjacent pieces 124A, 124B, arcing can occur to the substrate support 126. The arcing occurs due to the potential difference between the RF current along the substrate support 126 and the RF current at the edges of the pieces 124A, 124B or the RF current from the showerhead 110 or even from the plasma 120. If the electrically conductive substrate support 126 is exposed by the space between adjacent shadow frame pieces 124A, 124B, arcing may occur. The arcing can be eliminated or substantially reduced by replacing the portion of the substrate support 126 that would be exposed by the space between adjacent shadow frame pieces 124A, 124B with an insert 202 directly under the space between adjacent pieces 124A, 124B. The inserts 202 may comprise an electrically insulating material such as a ceramic material. The inserts 202 replace the corners of the substrate support 126 and extends into the substrate support 126 a distance shown by arrows "E" in a first direction and a distance shown by arrows "F" in a second direction in order to provide sufficient electrical isolation between the ends of adjacent pieces 124A, 124B and the electrically conductive portion of the substrate support 126. The inserts 202 operate to hide the exposed conductive surface of the substrate support 126 that is not in contact with the shadow frame pieces 124A, 124B.

Figure 3A:
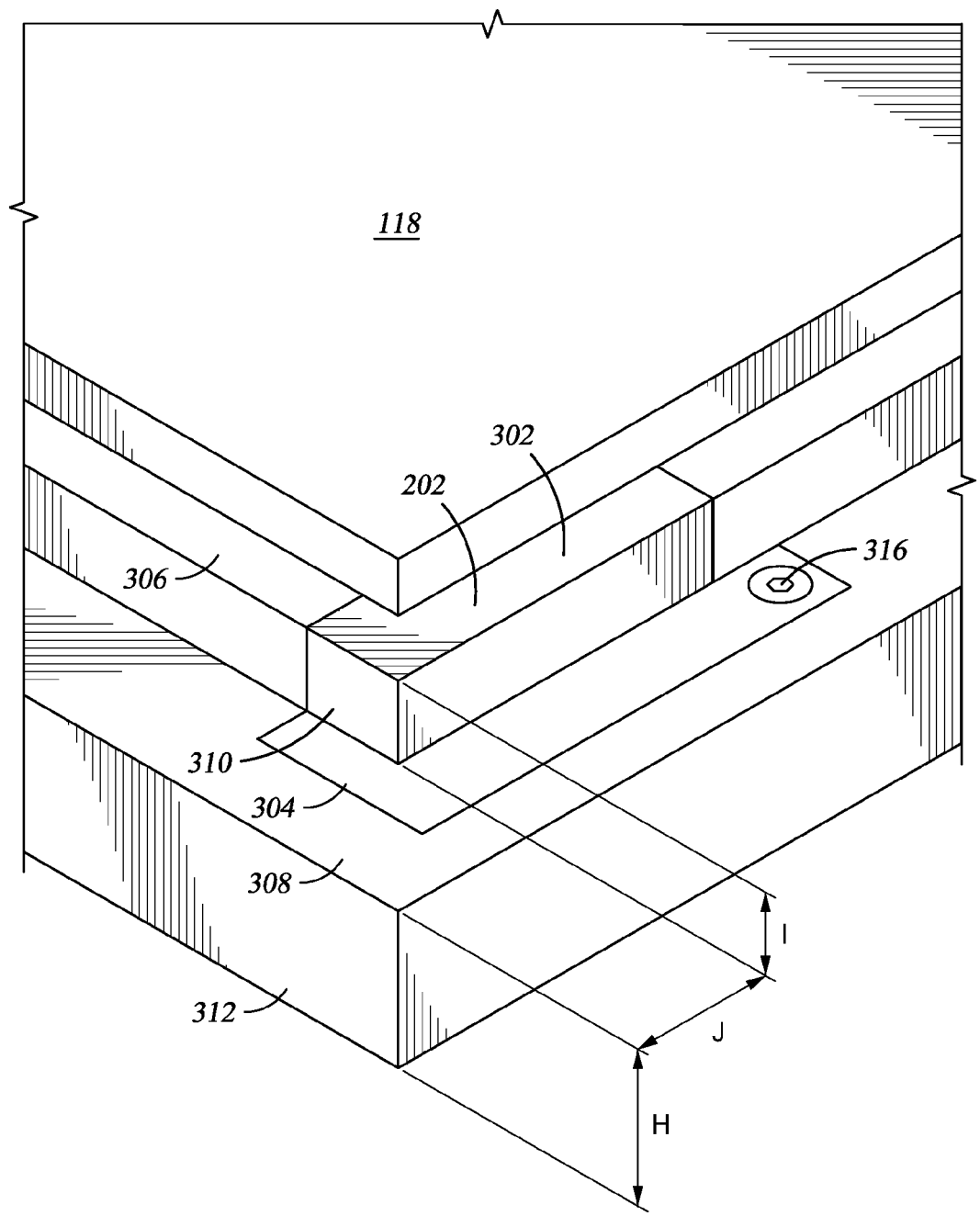
FIGS. 3A and 3B are a schematic isometric views of the substrate support according to an embodiment of the invention.
Figure 3B:
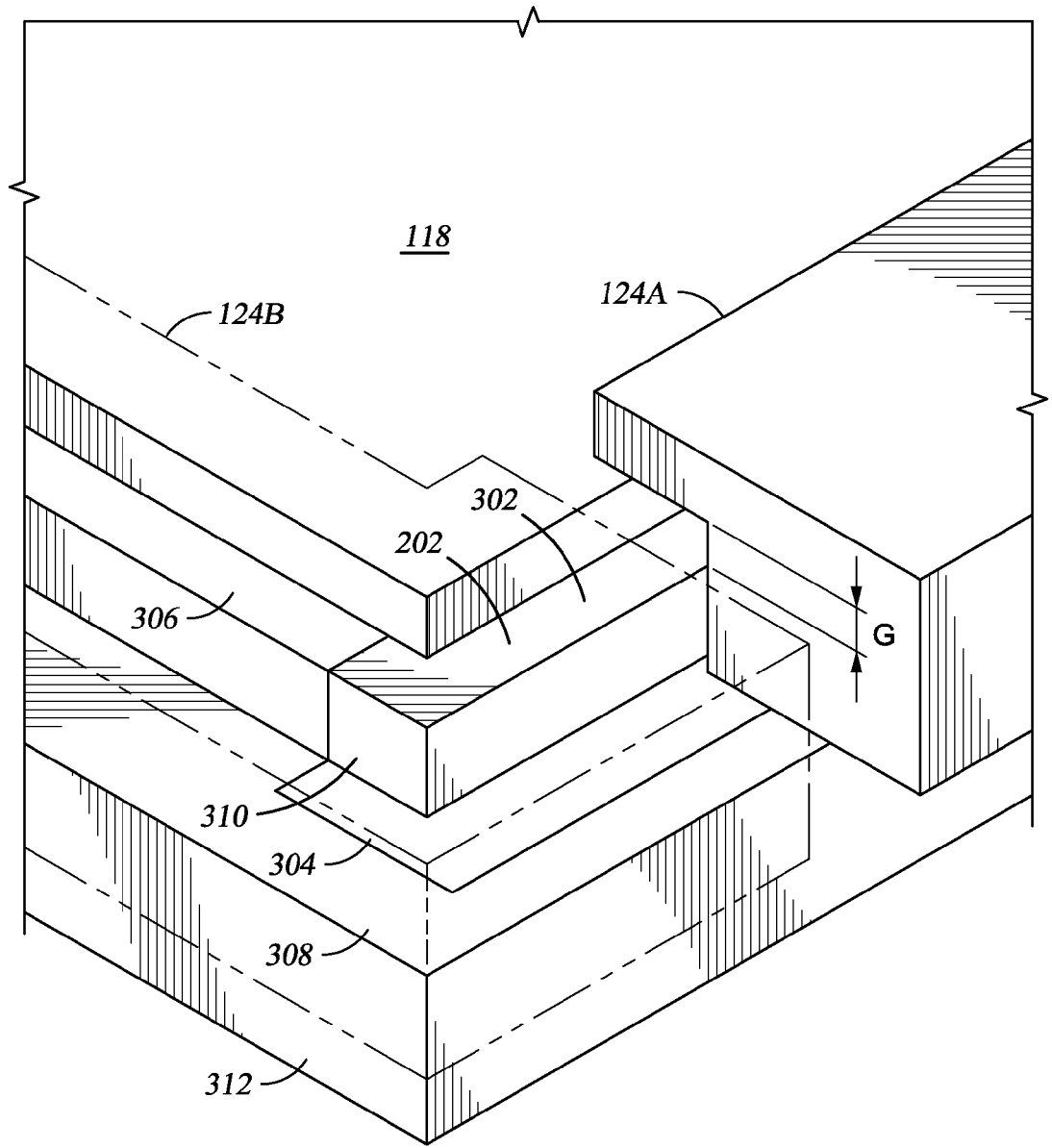

FIGS. 3A and 3B are a schematic isometric view of the substrate support 126 according to an embodiment of the invention. In FIG. 3A, the adjacent pieces 124A, 124B have been removed for clarity. In FIG. 3B, one piece 124A is shown while an adjacent piece 124B is shown in phantom. The substrate support 126 has recesses formed therein within which the inserts 202 are disposed. The recesses are formed in the both the topmost surface 306 of the substrate support 126 and the top surface 308 of the surrounding level upon which the shadow frame 124 rests. The inserts 202 are designed to fit within the recesses such that the exposed surfaces of the inserts 202 are flush with the exposed surfaces of the substrate support 126.

As shown in FIGS. 3A and 3B, the insert 202 has a top surface 302 of a first portion 310 that is parallel to the top surface 306 of the substrate support 126 and substantially flush with the top surface 306 of the substrate support 126. Additionally, the insert 202 has a second surface 304 that is flush with the top surface 308 of the surrounding level 312 of the substrate support 126 upon which the shadow frame 124 rests. The surrounding level 312 has a thickness shown by arrows "H" while the remainder of the substrate support 126 extends a distance represented by arrows "I" above the surrounding level 312. Thus, the substrate support 126 has a total thickness represented by arrows "H" and "I" collectively. The distance "C" is less than the width of the top surface 302 and thus, the space between adjacent pieces 124A, 124B is always over an electrically insulating material at the locations where the pieces 124A, 124B are spaced from the substrate support 126. In total, the insert 202 is sized such that there will be no location where the individual pieces 124A, 124B are: spaced apart, spaced from the substrate support 126, and adjacent or above a conductive portion of the substrate support 126.

The pieces 124A, 124B of the shadow frame 124 rest on the top surface 308 of the surrounding level 312 of the substrate support 126 and thus are in direct electrical contact with the surrounding level 312 of the substrate support 126. However, the shadow frame pieces 124A, 124B are spaced from the top surface 302 of the insert 202 by a distance shown by arrows "G". In absence of the insert 202, the shadow frame 124 would be spaced a distance "G" from the conductive substrate support 126 and thus, could easily arc therebetween. The insert 202, being electrically insulating and disposed directly beneath the space between adjacent pieces 124A, 124B of the shadow frame 124, prevent, or at the very least reduce, arcing between the pieces 124A, 124B and the substrate support 126.

It is important to understand that while the inserts 202 have been described as pieces that replace a portion of the substrate support 126 that has been removed, it is contemplated that the inserts 202 may comprise a cover disposed over a portion of the substrate support 126 without removing any portion of the substrate support 126. Additionally, it is contemplated that the second surface 304 insert 202 can extend across the entire distance shown by arrows "J" and may be fastened to the substrate support 126 by any suitable fastener 316.

By placing a portion of an electrically conductive substrate support with an electrically insulating material, arcing between the substrate support and a shadow frame disposed thereover during processing may be reduced or even eliminated. Thus, large area substrates can be easily processed under predictable processing chamber conditions.

While the foregoing is directed to embodiments of the present invention, other and further embodiments of the invention may be devised without departing from the basic scope thereof, and the scope thereof is determined by the claims that follow.

The invention claimed is:

1. A substrate support, comprising:
   a rectangular substrate support body having a stepped structure, comprising:
      a perimeter region; and
      a central region, wherein a surface of the perimeter region is lower than a surface of the central region; and
   a discontinuous ceramic insert having a width and a length less than a width and a length of the central region and positioned to replace a corner portion along an edge of the central region of the substrate support body, wherein a top surface of the ceramic insert is coplanar with the surface of the central region of the substrate support body and a bottom surface of the ceramic insert is coplanar with the surface of the perimeter region of the substrate support body.

2. The substrate support of claim 1, wherein the substrate support body comprises anodized aluminum.

3. The substrate support of claim 2, wherein the top surface of the ceramic insert has a length and a width, wherein the length is greater than the width.

4. The substrate support of claim 1, wherein the top surface of the ceramic insert has a length and a width, wherein the length is greater than the width.

5. A plasma enhanced chemical vapor deposition apparatus, comprising:
   a chamber body;
   a gas distribution showerhead disposed in the chamber body;
   a rectangular substrate support body disposed in the chamber body opposite the gas distribution showerhead and having a stepped structure, comprising:
      a perimeter region; and
      a central region, wherein a surface of the perimeter region is lower than a surface of the central region;
   a discontinuous ceramic insert positioned to replace a corner portion of the central region of the substrate support body, wherein a top surface of the ceramic insert is coplanar with the surface of the central region of the substrate support body and a bottom surface of the ceramic insert is coplanar with the surface of the perimeter region of the substrate support body; and
   a rectangular shadow frame disposed in the chamber body, the shadow frame comprising:
      a first piece;
      a second piece spaced from the first piece by a gap, wherein the gab is disposed over the ceramic insert;
      one or more coupling elements coupled to the first piece and the second piece, the one or more coupling elements extending across the gap between the first piece and the second piece; and
      one or more fasteners configured to couple the one or more coupling elements to the first piece and the second piece.

6. The apparatus of claim 5, wherein the first piece and the second piece comprise a ceramic material.

7. The apparatus of claim 6, wherein the coupling element comprises a metallic material.

8. The apparatus of claim 7, wherein the metallic material comprises aluminum.

9. The apparatus of claim 8, wherein the substrate support comprises anodized aluminum.

10. The apparatus of claim 9, wherein the top surface of the ceramic insert has a length and a width, wherein the length is greater than the width.

11. The apparatus of claim 5, wherein a width of the gap is less than a width of the ceramic insert.

* * * * *

UNITED STATES PATENT AND TRADEMARK OFFICE
CERTIFICATE OF CORRECTION

Page 1 of 1

PATENT NO. : 9,187,827 B2
APPLICATION NO. : 13/773579
DATED : November 17, 2015
INVENTOR(S) : Furuta et al.

It is certified that error appears in the above-identified patent and that said Letters Patent is hereby corrected as shown below:

In the Claims:

Column 6, Claim 5, Line 40, please delete "gab" and insert --gap-- therefor.

Signed and Sealed this
First Day of March, 2016

Michelle K. Lee
*Director of the United States Patent and Trademark Office*